(12) United States Patent
Sakui et al.

(10) Patent No.: US 9,076,824 B2
(45) Date of Patent: Jul. 7, 2015

(54) MEMORY ARRAYS WITH A MEMORY CELL ADJACENT TO A SMALLER SIZE OF A PILLAR HAVING A GREATER CHANNEL LENGTH THAN A MEMORY CELL ADJACENT TO A LARGER SIZE OF THE PILLAR AND METHODS

(71) Applicant: MICRON TECHNOLOGY, INC, Boise, ID (US)

(72) Inventors: Koji Sakui, Tokyo (JP); Peter Feeley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 336 days.

(21) Appl. No.: 13/667,649

(22) Filed: Nov. 2, 2012

(65) Prior Publication Data

US 2014/0126290 A1    May 8, 2014

(51) Int. Cl.
*G11C 16/04* (2006.01)
*H01L 29/66* (2006.01)
*H01L 29/788* (2006.01)
*H01L 29/792* (2006.01)
*H01L 27/115* (2006.01)

(52) U.S. Cl.
CPC ...... *H01L 29/66825* (2013.01); *G11C 16/0416* (2013.01); *H01L 29/7889* (2013.01); *H01L 29/7926* (2013.01); *H01L 27/11556* (2013.01); *H01L 27/11582* (2013.01); *H01L 29/66833* (2013.01)

(58) Field of Classification Search
USPC ............ 365/185.17, 185.05; 257/319, E29.3, 257/E21.101
See application file for complete search history.

(56) References Cited

U.S. PATENT DOCUMENTS

| | | | |
|---|---|---|---|
| 7,679,133 B2 | 3/2010 | Son et al. | |
| 7,696,559 B2 | 4/2010 | Arai et al. | |
| 8,163,617 B2 * | 4/2012 | Ahn | 438/259 |
| 8,183,112 B2 | 5/2012 | Lee et al. | |
| 2008/0173928 A1 | 7/2008 | Arai et al. | |
| 2009/0294828 A1 | 12/2009 | Ozawa et al. | |
| 2009/0310425 A1 | 12/2009 | Sim et al. | |
| 2010/0078701 A1 | 4/2010 | Shim et al. | |
| 2010/0097858 A1 | 4/2010 | Tokiwa et al. | |
| 2010/0140685 A1 | 6/2010 | Kang et al. | |
| 2010/0181612 A1 * | 7/2010 | Kito et al. | 257/319 |
| 2011/0073866 A1 | 3/2011 | Kim et al. | |
| 2012/0091521 A1 | 4/2012 | Goda | |

OTHER PUBLICATIONS

R. Katsumata et al. "Pipe-Shaped BiCS Flash Meory With 16 Stacked Layers and Multi-Level-Cell Operation for Ultra High Density Storage Devices", 2009 Symposium on VLSI Technology Digest of Technical Papers, pp. 136-137.

* cited by examiner

*Primary Examiner* — Vu Le
(74) *Attorney, Agent, or Firm* — Dicke, Billig & Czaja, PLLC

(57) ABSTRACT

The disclosure is related to memory arrays and methods. One such memory array has a substantially vertical pillar. A memory cell adjacent to the pillar where the pillar has a first size has a greater channel length than a memory cell adjacent to the pillar where the pillar has a second size larger than the first size.

31 Claims, 13 Drawing Sheets

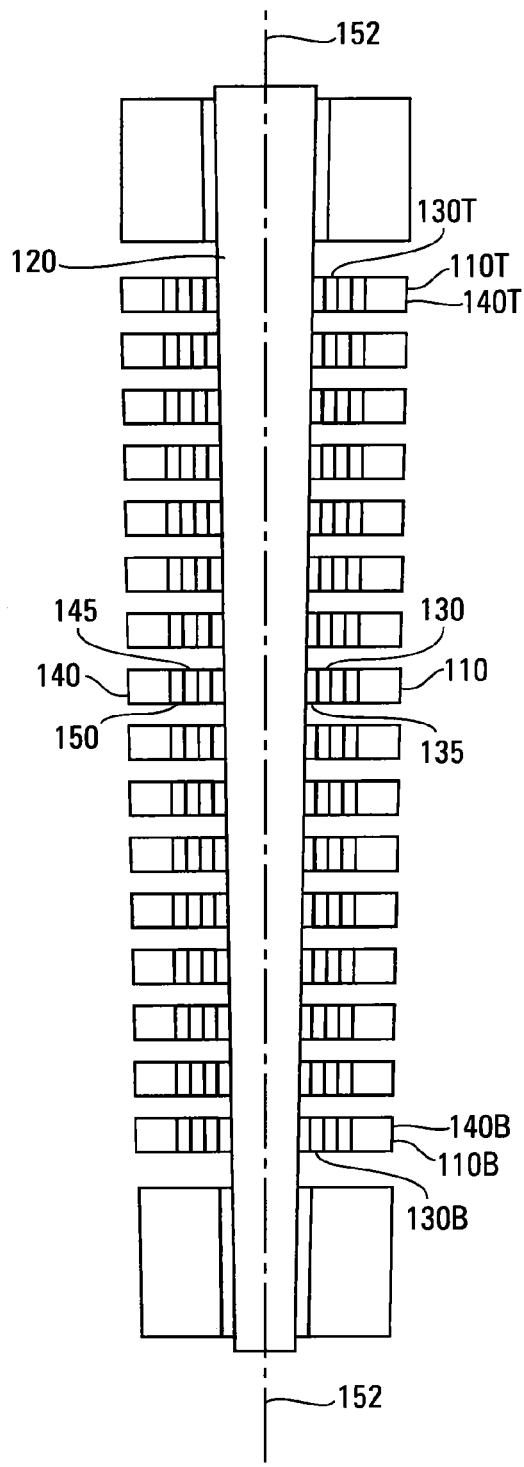
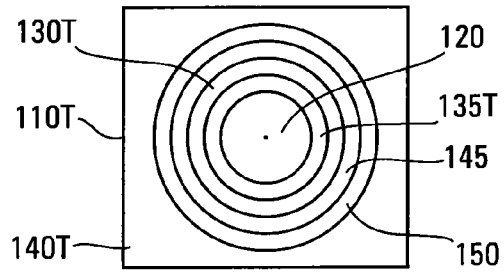
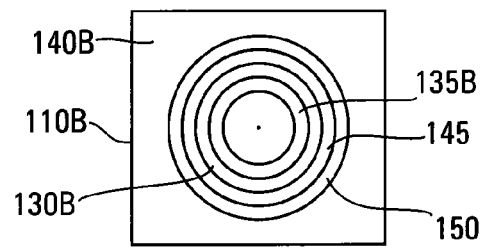
FIG. 1A
Prior Art
FIG. 1B
Prior Art
FIG. 1C
Prior Art

MEMORY ARRAYS WITH A MEMORY CELL ADJACENT TO A SMALLER SIZE OF A PILLAR HAVING A GREATER CHANNEL LENGTH THAN A MEMORY CELL ADJACENT TO A LARGER SIZE OF THE PILLAR AND METHODS

FIELD

The present disclosure relates generally to memory arrays, and, in particular, the present disclosure relates to memory arrays with a memory cell adjacent to a smaller size of a pillar having a greater channel length than a memory cell adjacent to a larger size of the pillar and methods.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line.

A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

In order for memory manufacturers to remain competitive, memory designers are constantly trying to increase the density of memory devices. Increasing the density of a flash memory device generally requires reducing spacing between memory cells and/or making memory cells smaller. Smaller dimensions of some device elements may cause operational problems with the cell.

One way of increasing the density of memory devices is to form stacked memory arrays, e.g., often referred to as three-dimensional memory arrays. For example, one type of three-dimensional memory array may include pillars of stacked memory elements, such as substantially vertical NAND strings.

FIG. 1A is a cross-sectional view of a portion of a memory array of the prior art that includes a substantially vertical string of memory cells 110 (e.g., memory cells $110_B$ to $110_T$ coupled in series) located adjacent to a substantially vertical semiconductor pillar 120 that may act as channel region for the substantially vertical string of memory cells 110. For example, during operation of one or more memory cells 110 of the string, a channel can be formed in the semiconductor pillar 120.

FIGS. 1B and 1C respectively show cross-sections of memory cells $110_T$ and $110_B$ located at different levels (e.g., vertical levels) within the memory array (e.g., within the string). For example, memory cell $110_T$ is located at a vertical level (e.g., near the top of the memory array) that is above a vertical level (e.g., near the bottom of the memory array) at which memory cell $110_B$ is located.

Each memory cell 110 may have a charge-storage structure (e.g., that may be a conductive floating gate, a dielectric charge trap, etc). For example, memory cell $110_T$ may have a charge-storage structure $130_T$, and memory cell $110_B$ may have a charge-storage structure $130_B$. Each memory cell 110 may have a tunnel dielectric 135 interposed between its charge-storage structure 130 and pillar 120. For example, memory cell $110_T$ may have a tunnel dielectric $135_T$ interposed between charge-storage structure $130_T$ and pillar 120, and memory cell $110_B$ may have a tunnel dielectric $135_B$ interposed between charge-storage structure $130_B$ and pillar 120. Each memory cell 110 may have a control gate 140 (e.g., as a portion of or coupled to access lines, such as word lines). For example, memory cells $110_T$ and $110_B$ may respectively include control gates $140_T$ and $140_B$. Each memory cell 110 may have dielectrics 145 and 150 interposed between its charge-storage structure 130 and control gate 140.

Semiconductor pillar 120 may be tapered in a direction from top to bottom, causing the size of, such as the cross-sectional area and/or the perimeter of, semiconductor pillar 120 to be smaller at memory cell $110_B$ near the bottom of the memory array than the size of, such as the cross-sectional area and/or the perimeter of, semiconductor pillar 120 at memory cell $110_T$ near the top of the memory array, as shown in FIGS. 1A-1C. The cross-sectional area and/or the outer perimeter of charge-storage structure $130_B$ where the pillar 120 has a smaller cross-sectional area and perimeter may be smaller than the cross-sectional area and/or the outer perimeter of charge-storage structure $130_T$ where the pillar 120 has a larger cross-sectional area and perimeter.

The cross-sectional area may be defined as the area of a cross-section that is substantially perpendicular to (e.g., that is perpendicular to) the longitudinal central axis 152, e.g., that may be substantially vertical, of pillar 120. For example, the cross-sectional areas of pillar 120 and charge-storage structures 130 are respectively the areas of the cross-sections of pillar 120 and the charge-storage structures 130 shown in FIGS. 1B and 1C.

Semiconductor pillar 120, the charge-storage structures 130, the tunnel dielectrics 135, and the dielectrics 145 and 150 are sometimes formed in an opening formed though a material, such as alternating dielectrics and conductors, e.g., that form the control gates 140, and therefore may take on the overall shape of the openings. In some instances, the process, e.g., etching, that forms the opening results in an opening that tapers in a direction from top to bottom, thereby causing the cross-sectional area of semiconductor pillar 120, the cross-sectional areas of charge-storage structures 130, the cross-sectional areas of tunnel dielectrics 135, and the cross-sectional areas of the dielectrics 145 and 150 to decrease in a direction from top to bottom of the array.

The difference in the cross-sectional areas of the pillar 120 at memory cells $110_T$ and $110_B$ and/or the difference in the cross-sectional areas of the charge-storage structures 130 of memory cells $110_T$ and $110_B$ can cause differences in the programming and erase properties of memory cells $110_T$ and $110_B$. This means that the programming and erase properties of the memory cells may vary over the height of the string of memory cells. For example, the channel capacitance at memory cell memory cell $110_B$ might be less than the channel capacitance at memory cell $110_T$, resulting in memory cell $110_B$ programming and erasing more quickly than memory cell $110_T$.

The number of electrons that can be stored in charge-storage structure $130_B$ of memory cell $110_B$ may be less than the number of electrons that can be stored in charge-storage structure $130_T$ of memory cell $110_T$. This can cause memory cell $110_B$ to have a shorter retention time than memory cell $110_T$, and thus wider threshold voltage ranges for given program levels than memory cell $110_T$. For example, the loss or gain of an electron in charge-storage structure $130_B$ may produce a larger change in the threshold voltage of memory cell $110_B$ than the loss or gain of an electron in charge-storage structure $130_T$ on the threshold voltage of memory cell $110_T$.

For the reasons stated above, and for other reasons stated below which will become apparent to those skilled in the art upon reading and understanding the present specification, there is a need in the art for alternatives to existing memory arrays with pillars of stacked memory elements.

BRIEF DESCRIPTION OF THE DRAWINGS

FIG. 1A presents an example of a memory array of the prior art.

FIGS. 1B and 1C respectively show cross-sections of memory cells located at different levels within the memory array of FIG. 1A.

DETAILED DESCRIPTION

Figure 2:
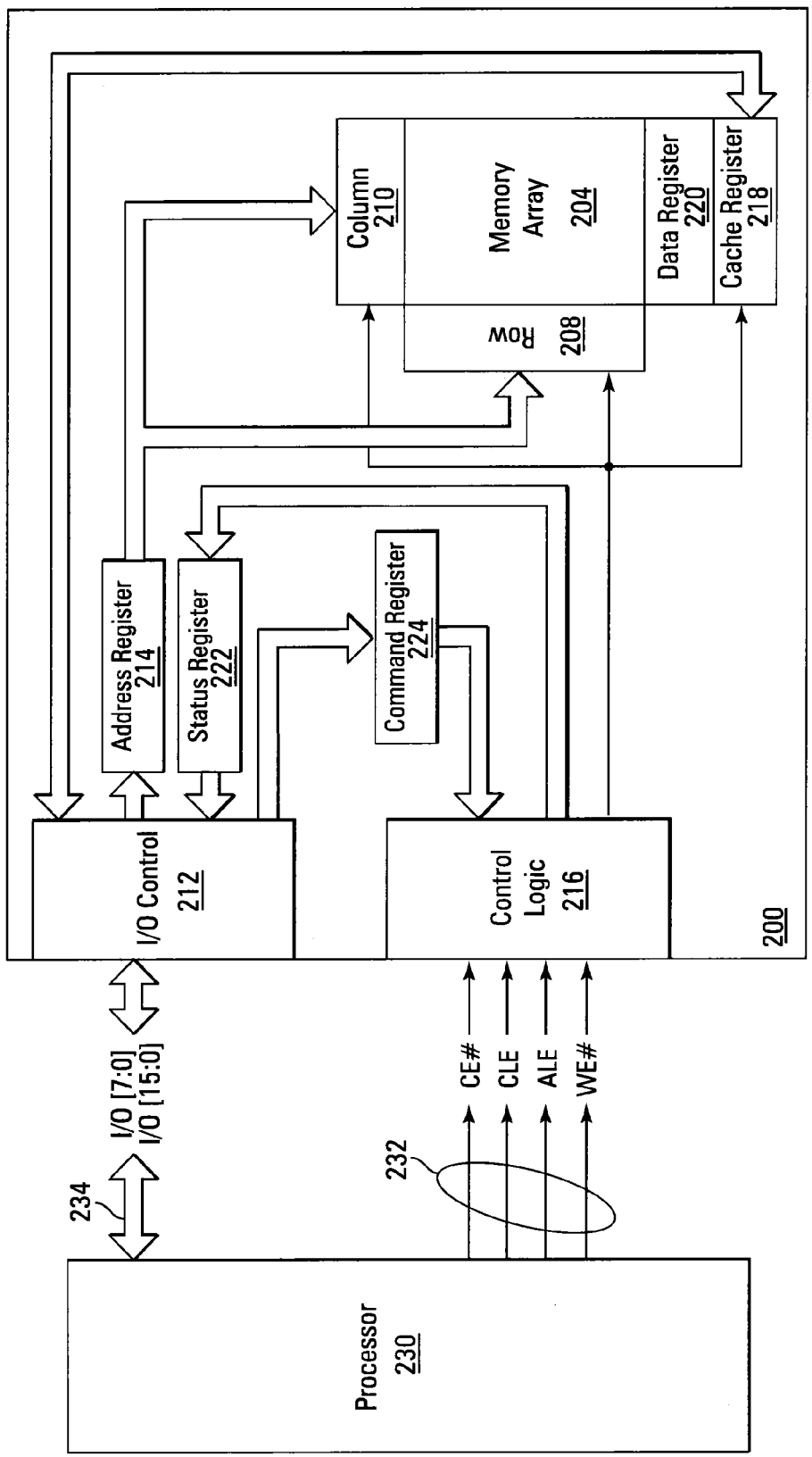
FIG. 2 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 2 is a simplified block diagram of a NAND flash memory device 200 in communication with a processor 230 as part of an electronic system, according to an embodiment. The processor 230 may be a memory controller or other external host device. Memory device 200 includes an array of memory cells 204 formed in accordance with embodiments of the disclosure. A row decoder 208 and a column decoder 210 are provided to decode address signals. Address signals are received and decoded to access memory array 204.

For some embodiments, memory array 204 may include a substantially vertical pillar. A memory cell adjacent to the pillar where the pillar has a first size may have a greater channel length than a memory cell adjacent to the pillar where the pillar has a second size that is larger than the first size.

Memory device 200 also includes input/output (I/O) control circuitry 212 to manage input of commands, addresses, and data to the memory device 200 as well as output of data and status information from the memory device 200. An address register 214 is in communication with I/O control circuitry 212, and row decoder 208 and column decoder 210 to latch the address signals prior to decoding. A command register 224 is in communication with I/O control circuitry 212 and control logic 216 to latch incoming commands. Control logic 216 controls access to the memory array 204 in response to the commands and generates status information for the external processor 230. The control logic 216 is in communication with row decoder 208 and column decoder 210 to control the row decoder 208 and column decoder 210 in response to the addresses.

Control logic 216 is also in communication with a cache register 218. Cache register 218 latches data, either incoming or outgoing, as directed by control logic 216 to temporarily store data while the memory array 204 is busy writing or reading, respectively, other data. During a write operation, data is passed from the cache register 218 to data register 220 for transfer to the memory array 204; then new data is latched in the cache register 218 from the I/O control circuitry 212. During a read operation, data is passed from the cache register 218 to the I/O control circuitry 212 for output to the external processor 230; then new data is passed from the data register 220 to the cache register 218. A status register 222 is in communication with I/O control circuitry 212 and control logic 216 to latch the status information for output to the processor 230.

Memory device 200 receives control signals at control logic 216 from processor 230 over a control link 232. The control signals may include at least a chip enable CE#, a command latch enable CLE, an address latch enable ALE, and a write enable WE#. Memory device 200 receives command signals (which represent commands), address signals (which represent addresses), and data signals (which represent data) from processor 230 over a multiplexed input/output (I/O) bus 234 and outputs data to processor 230 over I/O bus 234.

For example, the commands are received over input/output (I/O) pins [7:0] of I/O bus 234 at I/O control circuitry 212 and are written into command register 224. The addresses are received over input/output (I/O) pins [7:0] of bus 234 at I/O control circuitry 212 and are written into address register 214. The data are received over input/output (I/O) pins [7:0] for an 8-bit device or input/output (I/O) pins [15:0] for a 16-bit device at I/O control circuitry 212 and are written into cache register 218. The data are subsequently written into data register 220 for programming memory array 204. For another embodiment, cache register 218 may be omitted, and the data are written directly into data register 220. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O pins are described in accordance with popular conventions for receipt and output of the various signals, it is noted that other combinations or numbers of I/O pins may be used in the various embodiments.

Figure 3A:
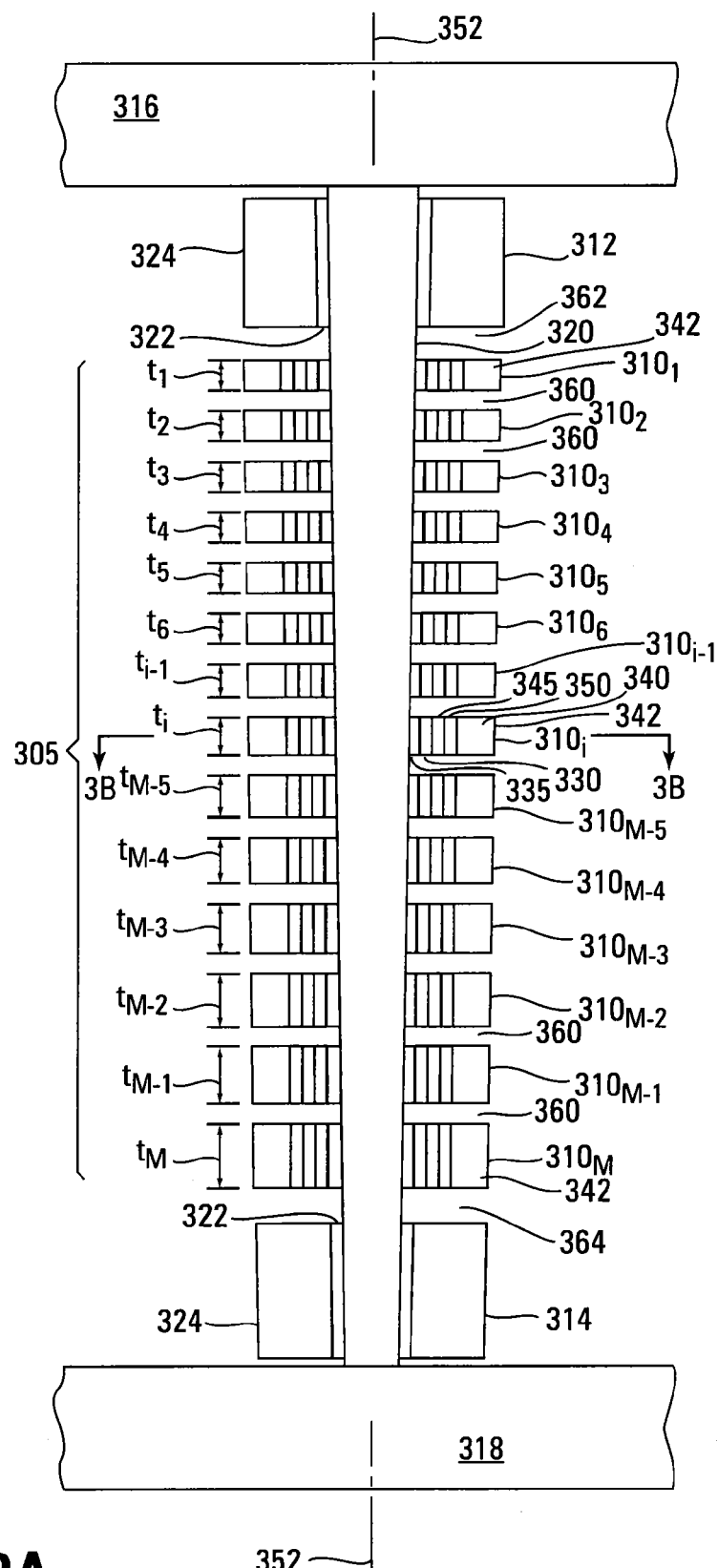
FIG. 3A is a cross-sectional view of a portion of a memory array, according to an embodiment.
Figure 3B:
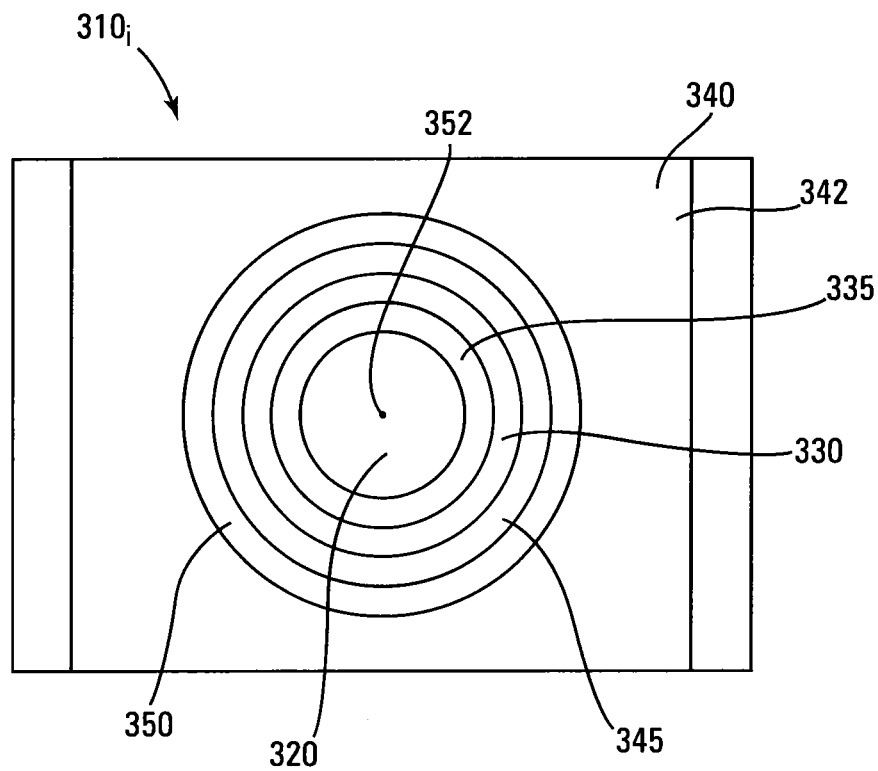
FIG. 3B is a cross-section viewed along line 3B-3B in FIG. 3A.

FIG. 3A is a cross-sectional view of a portion of a memory array, such as a portion of memory array 204 in FIG. 2. FIG. 3B is a cross-section viewed along line 3B-3B in FIG. 3A. In FIG. 3A, a substantially vertical (e.g., a vertical) string 305 (e.g. a NAND string) of series-coupled memory cells 310 (e.g., memory cells $310_1$ to $310_M$) may be located adjacent to (e.g., in contact with) a substantially vertical (e.g., a vertical) semiconductor (e.g., conductively doped polysilicon) structure, such as a substantially vertical (e.g., a vertical) semiconductor pillar 320, that may act as channel region for string 305. For example, during operation of one or more memory cells 310 of string 305, a channel can be formed in the semiconductor pillar 320.

Each memory cell 310 of string 305 may be coupled in series with and may be between a select gate (e.g., a drain select gate) 312 adjacent to (e.g., in contact with) pillar 320 and a select gate (e.g., a source select gate) 314 adjacent to (e.g., in contact with) pillar 320. Select gate 312 may selectively couple string 305 to a data line (e.g., a bit line 316). Select gate 314 may selectively couple string 305 to a source 318. For example, select gate 312 may be coupled in series with memory cell $310_1$, and select gate 314 may be coupled in series with memory cell $310_M$. Select gates 312 and 314 may each include a gate dielectric 322 adjacent to (e.g., in contact with) pillar 320 and a control gate 324 adjacent to (e.g., in contact with) a corresponding gate dielectric 322.

Each memory cell 310 may be a non-volatile memory cell and may have a charge-storage structure 330, such as a floating gate that may be a conductor (e.g., polysilicon), a charge trap that may be a dielectric, etc. Non-limiting examples of dielectrics that are suitable for charge traps include nitrides, high-dielectric constant (high-K) dielectrics, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$.

Each memory cell 310 may have a tunnel dielectric 335 interposed between its charge-storage structure 330 and pillar 320. Each memory cell 310 may have a control gate 340 (e.g., as a portion of or coupled to an access line, such as a word line 342). Each memory cell 310 may have dielectrics 345 and 350 interposed between its charge-storage structure 330 and control gate 340.

A dielectric 360 may be interposed between successively adjacent memory cells 310 in string 305, as shown in FIG. 3A. For example, a dielectric 360 may be interposed between at least the floating gates 330, the dielectrics 345 and 350, and the control gates 340 of successively adjacent memory cells 310. A dielectric 362 may be interposed between an end (e.g., between memory cell $310_1$) of string 305 and select gate 312, and a dielectric 364 may be interposed between an opposite end (e.g., between memory cell $310_M$) of string 305 and select gate 314, as shown in FIG. 3A.

Figure 3C:
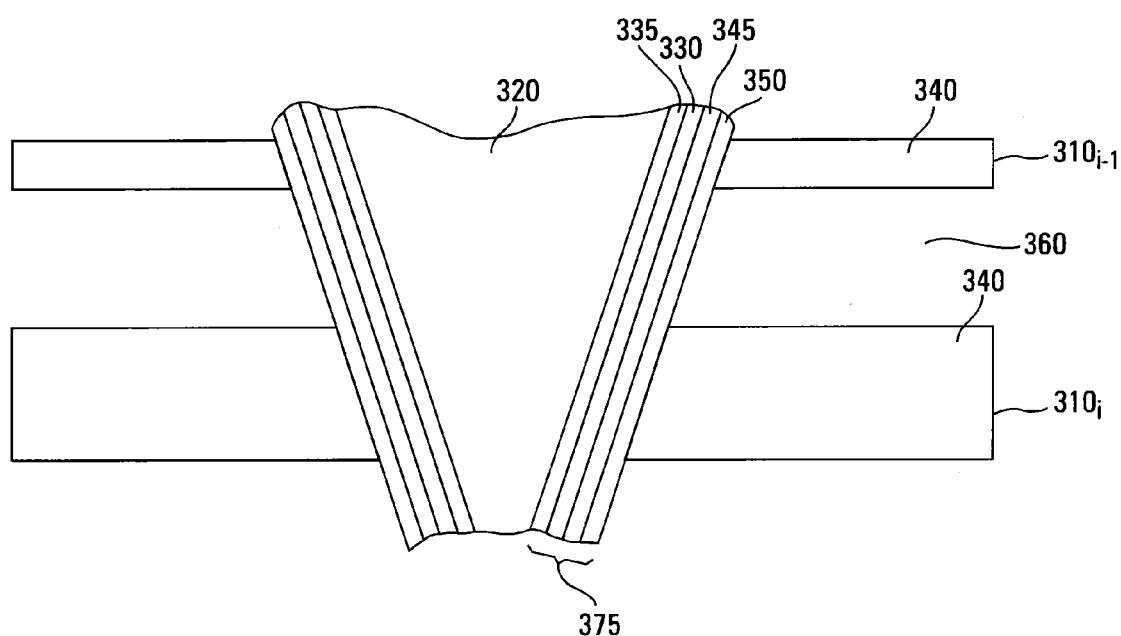
FIG. 3C is a cross-sectional view illustrating an embodiment where multiple memory cells share a charge-storage structure.

For some embodiments, where the charge-storage structure 330 is a charge trap, tunnel dielectric 335, charge-storage structure 330, and dielectrics 345 and 350 may form a continuous structure 375 that may be shared by (e.g., that may be common to) two or more memory cells 310 (e.g., memory cells $310_{i-1}$ and $310_i$ in FIG. 3C). For example, structure 375 may be shared by (e.g., may be common to) memory cells $310_1$ to $310_M$.

Semiconductor pillar 320 may be tapered in a direction from top to bottom, causing the size of, such as the cross-sectional area and/or the perimeter of, semiconductor pillar 320 to be smaller at memory cell $310_M$ near the bottom of the memory array than the size of, such as the cross-sectional area and/or the perimeter of, semiconductor pillar 320 at memory cell $310_1$ near the top of the memory array, as shown in FIG. 3A. For example, the size of pillar 320 may decrease with increasing distance from the top of pillar 320.

The cross-sectional area of the charge-storage structure 330 of a memory cell 310 (e.g., memory cell $310_M$) where the pillar 320 has a smaller size may be smaller than the cross-sectional area of the charge-storage structure 330 of a memory cell 310 (e.g., memory cell $310_1$) where the pillar 120 has a larger size. For example, the cross-sectional areas of the charge-storage structures 330 of memory cells $310_1$ to $310_M$ may decrease as the cross-sectional area and perimeter of pillar 320 decreases.

Size as used herein may refer to a cross-sectional area and/or perimeter around the cross-sectional area. For example, a size of the pillar may refer to the cross-sectional area of a given cross-section of the pillar and/or the perimeter around the given cross-section of the pillar. A cross-sectional area may be defined as the area of a cross-section that is substantially perpendicular to (e.g., that is perpendicular to) the longitudinal central axis 352, e.g., that may be substantially vertical (e.g. vertical), of pillar 320. For example, the areas of pillar 320, charge-storage structure 330, tunnel dielectric 335, and dielectrics 345 and 350 in the cross-section of FIG. 3B are examples of cross-sectional areas of pillar 320, charge-storage structure 330, tunnel dielectric 335, and dielectrics 345 and 350.

For some embodiments, the thicknesses (e.g., the channel lengths) t of the memory cells 310, e.g., in the vertical direction, may increase as the size of pillar 320 decreases, e.g., starting with memory cell $310_i$. For example, the thicknesses of the control gates 340 of the memory cells 310 may increase as the size of pillar 320 decreases, e.g., starting with memory cell $310_i$. For example, channel lengths $t_1$ to $t_{i-1}$ (e.g., the thicknesses of the control gates) respectively of memory cells $310_1$ to $310_{i-1}$ may be substantially the same, whereas the channel length $t_i$ of memory cell $310_i$, may be greater than the channel length $t_{i-1}$ of memory cell $310_{i-1}$, the channel length $t_{M-5}$ of memory cell $310_{M-5}$ may be greater than the channel length $t_i$ of memory cell $310_i$, the channel length $t_{M-4}$ of memory cell $310_{M-4}$, may be greater than the channel length $t_{M-5}$ of memory cell $310_{M-5}$, the channel length $t_{M-3}$ of memory cell $310_{M-3}$ may be greater than the channel length $t_{M-4}$ of memory cell $310_{M-4}$, the channel length $t_{M-2}$ of memory cell $310_{M-2}$ may be greater than the channel length $t_{M-3}$ of memory cell $310_{M-3}$, the channel length $t_{M-1}$ of memory cell $310_{M-1}$ may be greater than the channel length $t_{M-2}$ of memory cell $310_{M-2}$, and the channel length $t_M$ of memory cell $310_M$ may be greater than the channel length $t_{M-1}$ of memory cell $310_{M-1}$.

For some embodiments, the channel lengths of memory cells $310_i$ to $310_M$ may increase in proportion to the decrease in size of pillar 320. For example, the channel lengths (e.g., the thicknesses of the control gates) of memory cells $310_i$ to $310_M$ may increase as the size of pillar 320 decreases, e.g., with increasing distance from the top of pillar 320.

The channel lengths of memory cells $310_1$ to $310_{i-1}$ may be kept substantially the same to facilitate the manufacture of the string of memory cells, and because the size of pillar 320 at the regions respectively adjacent to (e.g., in contact with) memory cells $310_1$ to $310_{i-1}$ may have less of an impact on the programming and erasing of memory cells $310_1$ to $310_{i-1}$ than the size of pillar 320 on the programming and erasing of memory cells $310_1$ to $310_M$ at the regions respectively adjacent to (e.g., in contact with) memory cells $310_i$ to $310_M$. For example, the channel lengths may be the same for about 20 memory cells (e.g., i=21) from the top of string 305.

For some embodiments, the channel length of each of memory cells $310_i$ to $310_M$ may be such that the volumes of the charge-storage structures 330 of memory cells $310_i$ to $310_M$ are substantially equal to (e.g., are equal to) each other, e.g., such that the volumes of the charge-storage structures 330 of memory cells $310_i$ to $310_M$ are substantially independent of (e.g., are independent of) the size of pillar 320. For example, the channel length of each of memory cells $310_i$ to $310_M$ may be such that the volume of the charge-storage structure 330 of each of memory cells $310_i$ to $310_M$ is substantially equal to (e.g., is equal to) the volume of the charge-storage structure 330 of memory cell $310_{i-1}$ or the charge-storage structure 330 of any one of memory cells $310_1$ to $310_{i-1}$, or substantially equal to (e.g., equal to) an average of the volumes of the charge-storage structures 330 of memory cells $310_1$ to $310_{i-1}$.

For some embodiments, the channel length of each of memory cells $310_i$ to $310_M$ may be such that charge-storage structures 330 of memory cells $310_i$ to $310_M$ can store substantially equal numbers of electrons (e.g., store equal numbers of electrons). For example, the channel length of each of memory cells $310_i$ to $310_M$ may be such that the charge-storage structure 330 of each of memory cells $310_i$ to $310_M$ can store substantially the same number of electrons (e.g., the same number of electrons) as the charge-storage structure 330 of memory cell $310_{i-1}$ or as the charge-storage structure 330 of any one of memory cells $310_1$ to $310_{i-1}$, or can store a number of electrons substantially equal to (e.g., a number of electrons equal to) an average of the numbers of electrons the charge-storage structures 330 of memory cells $310_1$ to $310_{i-1}$ can store. The number of electrons that can be stored by a floating gate may be proportional to the volume of the floating gate for some embodiments, meaning that floating gates having substantially the same volumes can store substantially the same number of electrons for those embodiments.

In other embodiments, the channel length of each of memory cells $310_i$ to $310_M$ may be such that the outer surface areas of the portions of (e.g., the areas of the outer surfaces of the portions of) pillar 320 that are respectively adjacent to, e.g., that are respectively in contact with, memory cells $310_i$ to $310_M$ (e.g., in contact with the tunnel dielectrics 335 of memory cells $310_i$ to $310_M$) are substantially equal to each other. For example, the channel length of each of memory cells $310_i$ to $310_M$ may be such that the surface areas of the portions of pillar 320 that are adjacent to (e.g., are in contact with) respective ones of memory cells $310_i$ to $310_M$ are substantially the same as the surface area of the portion of pillar 320 that is adjacent to (e.g., is in contact with) memory cell $310_{i-1}$ or that is adjacent to (e.g., is in contact with) any one of memory cells $310_1$ to $310_{i-1}$, or that the surface areas of the portions of pillar 320 that are adjacent to (e.g., are in contact with) respective ones of memory cells $310_i$ to $310_M$ are substantially equal to an average of the surface areas of the portions of pillar 320 that are adjacent to (e.g., are in contact with) respective ones of memory cells $310_1$ to $310_{i-1}$.

For some embodiments, the channel length of each of memory cells $310_i$ to $310_M$ may be such the channel capacitances of memory cells $310_i$ to $310_M$ are substantially the same as (e.g., that same as) each other. For example, the channel length of each of memory cells $310_i$ to $310_M$ may be such that the channel capacitance of each of memory cells $310_i$ to $310_M$ is substantially equal to (e.g., is equal to) the channel capacitance of memory cell $310_{i-1}$ or the channel capacitance of any one of memory cells $310_1$ to $310_{i-1}$, or substantially equal to an average of the channel capacitances of memory cells $310_1$ to $310_{i-1}$.

For some embodiments, the channel lengths $t_1$ to $t_M$ (e.g., the thicknesses of the control gates) respectively of memory cells $310_1$ to $310_M$ may increase as the size of pillar 320 decreases. For example, the channel length $t_2$ of memory cell $310_2$ may be greater than the channel length $t_1$ of memory cell $310_1$; the channel length $t_3$ of memory cell $310_3$ may be greater than the channel length $t_2$ of memory cell $310_2$; the channel length $t_4$ of memory cell $310_4$ may be greater than the channel length $t_3$ of memory cell $310_3$; the channel length $t_5$ of memory cell $310_5$ may be greater than the channel length $t_4$ of memory cell $310_4$, the channel length $t_6$ of memory cell $310_6$ may be greater than the channel length $t_5$ of memory cell $310_5$; the channel length $t_{i-1}$ of memory cell $310_{i-1}$ may be greater than the channel length $t_6$ of memory cell $310_6$; the channel length $t_i$ of memory cell $310_i$ may be greater than the channel length $t_{i-1}$ of memory cell $310_{i-1}$; the channel length $t_{M-5}$ of memory cell $310_{M-5}$ may be greater than the channel length $t_i$ of memory cell $310_i$; the channel length $t_{M-4}$ of memory cell $310_{M-4}$ may be greater than the channel length $t_{M-5}$ of memory cell $310_{M-5}$; the channel length $t_{M-3}$ of memory cell $310_{M-3}$ may be greater than the channel length $t_{M-4}$ of memory cell $310_{M-4}$; the channel length $t_{M-2}$ of memory cell $310_{M-2}$ may be greater than the channel length $t_{M-3}$ of memory cell $310_{M-3}$; the channel length $t_{m-1}$ of memory cell $310_{M-1}$ may be greater than the channel length $t_{M-2}$ of memory cell $310_{M-2}$; and the channel length $t_M$ of memory cell $310_M$ may be greater than the channel length $t_{M-1}$ of memory cell $310_{M-1}$. For some embodiments, the channel lengths of memory cells $310_1$ to $310_M$ may increase in proportion to the decrease in the size of pillar 320.

For embodiments where the channel lengths $t_1$ to $t_M$ respectively of memory cells $310_1$ to $310_M$ increase as the size of pillar 320 decreases, the channel length for each of memory cells $310_1$ to $310_M$ may be such that the volumes of the charge-storage structures 330 of memory cells $310_1$ to $310_M$ are substantially equal to (e.g., are equal to) each other. For some embodiments, the channel length for each of memory cells $310_1$ to $310_M$ may be such that charge-storage structures 330 of memory cells $310_1$ to $310_M$ can store substantially equal numbers of electrons (e.g., can store equal numbers of electrons). In other embodiments, the channel length of each of memory cells $310_1$ to $310_M$ may be such that the surface areas of the portions of pillar 320 that are respectively adjacent to, e.g., that are respectively in contact with (e.g., in contact with the tunnel dielectrics 335 of), memory cells $310_1$ to $310_M$ are substantially equal to each other (e.g., are equal to each other). For some embodiments, the channel length of each of memory cells $310_1$ to $310_M$ may be such the channel capacitance of memory cells $310_1$ to $310_M$ is substantially the same (e.g., is the same).

Figure 4:
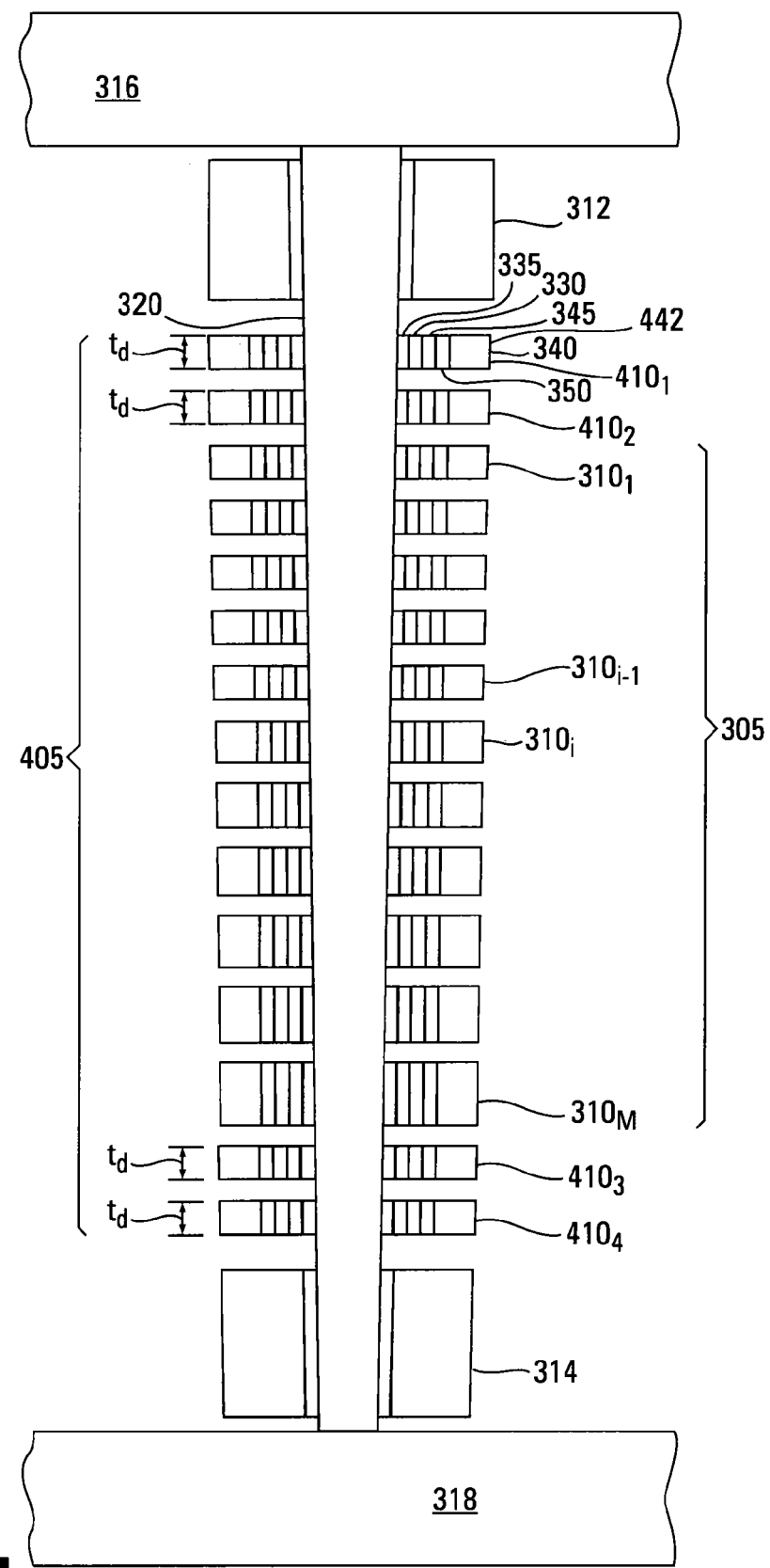
FIG. 4 is a cross-sectional view of a portion of a memory array, according to another embodiment.

For some embodiments, string 305 might be interposed between and coupled in series to "dummy" memory cells 410 to form a string 405 of memory cells that includes string 305 and "dummy" memory cells 410, as shown in FIG. 4. Common numbering is used in FIGS. 3A and 3B and FIG. 4 to denote similar components (e.g., the same components), e.g., which may be as described above in conjunction with FIGS. 3A and 3B.

For example, one or more "dummy" memory cells 410, such as "dummy" memory cells $410_1$ and $410_2$, might be interposed between and coupled in series with memory cell $310_1$ of string 305 and select gate 312, and one or more "dummy" memory cells 410, such as "dummy" memory cells $410_3$ and $410_4$, might be interposed between and coupled in series with memory cell $310_M$ of string 305 and select gate 314. For example, "dummy" memory cell $410_1$ might be coupled in series with select gate 312, and "dummy" memory cell $410_2$ might be coupled in series with memory cell $310_1$ and "dummy" memory cell $410_1$. "Dummy" memory cell $410_4$ might be coupled in series with select gate 314, and "dummy" memory cell $410_3$ might be coupled in series with memory cell $310_M$ and "dummy" memory cell $410_4$.

Each of "dummy" memory cells 410 might be configured in a manner similar to and may have the same components as memory cells 310, as described above in conjunction with FIGS. 3A and 3B. For example, each "dummy" memory cell 410 may be a non-volatile memory cell and may have a charge-storage structure 330. Each "dummy" memory cell 410 may have a tunnel dielectric 335 interposed between its charge-storage structure 330 and pillar 320. Each "dummy" memory cell 410 may have a control gate 340 (e.g., as a portion of or coupled to an access line, such as a word line 442). Each "dummy" memory cell 410 may have dielectrics 345 and 350 interposed between its charge-storage structure 330 and control gate 340.

Each of "dummy" memory cells 410 may have a thickness (e.g., a channel length) $t_d$. For example, "dummy" memory cells $410_1$ to $410_4$ may have the same channel length regardless of where in string 405 "dummy" memory cells $410_1$ to $410_4$ are located, e.g., regardless of the sizes of the portions of pillar 320 adjacent to (e.g., in contact with) "dummy" memory cells $410_1$ to $410_4$. For some embodiments, the channel length of each of "dummy" memory cells 410 may be substantially equal to the channel length $t_1$ of memory cell $310_1$ (FIG. 3A).

Figure 5:
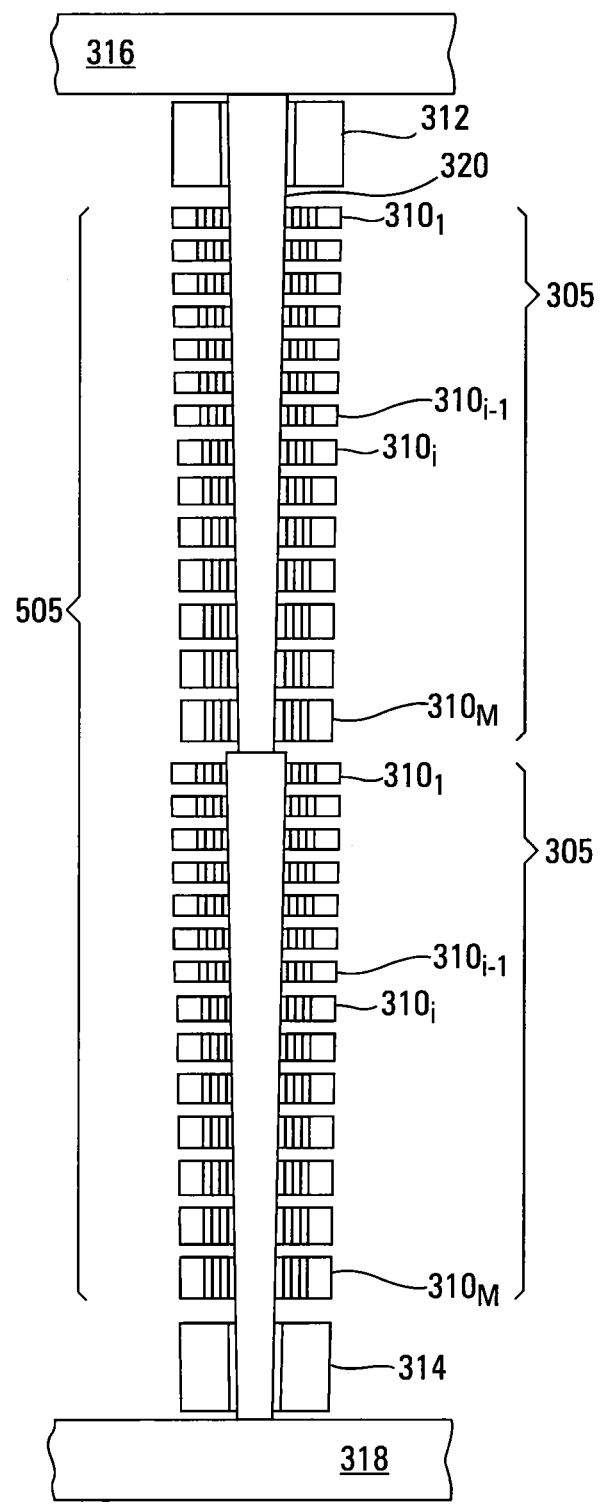
FIG. 5 is a cross-sectional view of a portion of a memory array, according to another embodiment.

FIG. 5 is a cross-sectional view of a portion of a memory array, such as a portion of memory array 204 in FIG. 2. Common numbering is used in FIGS. 3A and 5 to denote similar components (e.g., the same components), e.g., which may be as described above in conjunction with FIG. 3A.

In FIG. 5, a string 505 of memory cells 310 is formed adjacent to (e.g., in contact with) a plurality of substantially vertical (e.g., vertical) semiconductor pillars 320 (e.g., an upper pillar 320 and a lower pillar 320), stacked (e.g., vertically) one above the other. The semiconductor pillars 320 may act as a channel region for string 505. For example, during operation of one or more memory cells of string 505, a channel can be formed in upper and lower pillars 320.

Upper and lower pillars 320 may be coupled (e.g., physically and electrically) in series with each other. For example, upper and lower pillars 320 may be in direct physical contact with each other. For some embodiments, each of pillars 320 may be as described above in conjunction with FIG. 3A. For example, each of pillars 320 may be tapered in a direction from top to bottom, causing the size of each semiconductor pillar 320 to be smaller at memory cell $310_M$ near the bottom of the corresponding pillar 320 than the size of the corresponding pillar 320 at memory cell $310_1$ near the top of the respective pillar 320. Upper pillar 320 may taper (e.g., the size of upper pillar may decrease) until it reaches lower pillar 320.

Each memory cell of string 505 may be coupled in series with and may be between select gate 312 and select gate 314. Select gate 312 may selectively couple string 505 to bit line 316. Select gate 314 may selectively couple string 505 to source 318. For example, select gate 312 may be adjacent to (e.g., in contact with) the upper pillar 320, and select gate 314 may be adjacent to (e.g., in contact with) the lower pillar 320.

For some embodiments, string 505 may include an upper string 305 of series-coupled memory cells 310 formed adjacent to (e.g., in contact with) upper pillar 305 and a lower string 305 of series-coupled memory cells 310 formed adjacent to (e.g., in contact with) lower pillar 305, where the upper and lower strings 305 are coupled in series.

For some embodiments, the thicknesses (e.g., the channel lengths) of the memory cells 310 of each of the upper and lower strings 305 may vary with the size of the respective upper and lower pillars 320 in substantially (e.g. exactly) the same way as the thicknesses (e.g., the channel lengths) of the memory cells 310 of string 305 in FIG. 3A did with the size of the pillar 320 in FIG. 3A, e.g., as described above in conjunction with FIG. 3A. For example, the channel lengths of the memory cells $310_1$ to $310_{i-1}$ in each of the strings 305 in FIG. 5 may be substantially the same as (e.g., the same as) each other, whereas the channel lengths of the memory cells $310_i$ to $310_M$ of each of the strings 305 in FIG. 5 may increase as the size of the corresponding pillar 320 decreases. Alternatively, the channel lengths of the memory cells $310_1$ to $310_M$ of each of the strings 305 in FIG. 5 may increase as the size of the corresponding pillar 320 decreases.

Figure 6:
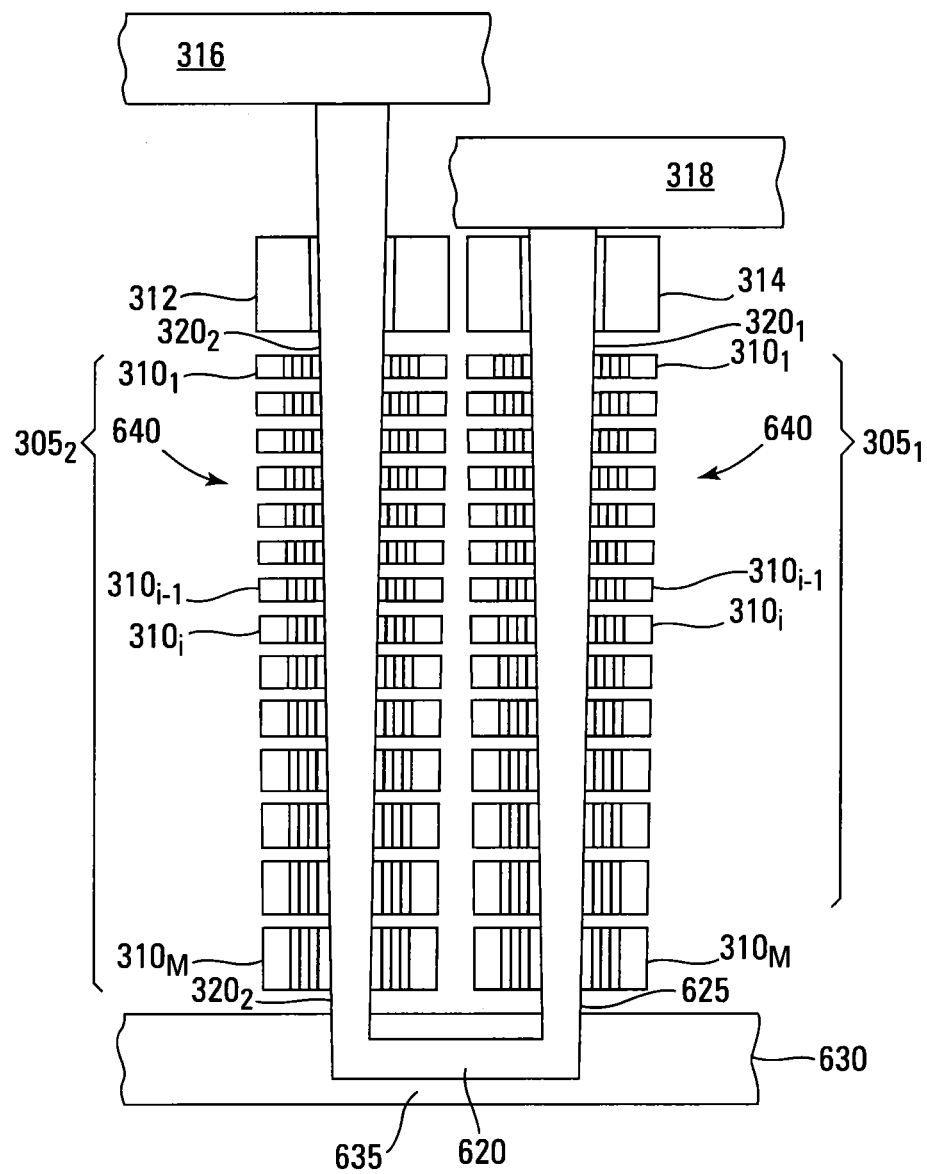
FIG. 6 is a cross-sectional view of a portion of a memory array, according to another embodiment.

FIG. 6 is a cross-sectional view of a portion of a memory array, such as a portion of memory array 204 in FIG. 2. Common numbering is used in FIGS. 3A and 6 to denote similar components (e.g., the same components), e.g., which may be as described above in conjunction with FIG. 3A.

In FIG. 6, strings 305 (e.g., strings $305_1$ and $305_2$) of memory cells 310 may be respectively adjacent to (e.g., in contact with) pillars 320 (e.g., pillars $320_1$ and $320_2$). Each of strings $305_1$ and $305_2$ may include series-coupled memory cells $310_1$ to $310_M$. For example, pillars $320_1$ and $320_2$ may be located laterally of each other, e.g., pillars $320_1$ and $320_2$ may be located side by side.

A semiconductor segment 620 (e.g., of the same material as pillars 320), that may be substantially horizontal, may physically couple pillar $320_1$ to pillar $320_2$ to form a semiconductor structure 625 that includes pillars $320_1$ and $320_2$. Semiconductor segment 620 may be a conductor 630 that may generally be formed of one or more conductive materials, such as conductively doped polysilicon.

Semiconductor segment 620 can electrically couple string $305_1$ in series with string $305_2$ upon applying an appropriate bias to conductor 630. For example, semiconductor segment 620 and conductor 630 may form a connector gate 635 that selectively couples string $305_1$ in series with string $305_2$. The selectively coupled strings $305_1$ and $305_2$ may form portions of a single string 640 of memory cells 310 (e.g., memory cells $310_1$ to $310_M$ of strings $305_1$ and $305_2$).

String 640 may be between and coupled in series with select gates 312 and 314. For example, each memory cell 310 of string 640 may be coupled in series with and may be between select gate 312 and select gate 314. Select gate 312 may be coupled in series with memory cell $310_1$ of string $305_2$, and select gate 314 may be coupled in series with memory cell $310_1$ of string $305_1$. Select gate 312 may selectively couple string 640 to bit line 316. Select gate 314 may selectively couple string 640 to source 318. Note, for example, that each memory cell of string $305_1$ may be between and coupled in series with select gate 314 and connector gate 635 and that each memory cell of string $305_2$ may be between and coupled in series with connector gate 635 and select gate 312. For some embodiments, select gate 312 may be adjacent to (e.g., in contact with) the pillar $320_2$, and select gate 314 may be adjacent to (e.g., in contact with) the pillar $320_1$.

FIGS. 7A-7F are cross-sectional views of a portion of a memory array, such as memory array 204 of FIG. 2, during various stages of fabrication. The formation of the structure of FIG. 7A may include forming a dielectric 702 over a semiconductor 700 that, in some embodiments, may be comprised of silicon, e.g., monocrystalline silicon, that may be conductively doped, e.g., to have an n-type conductivity, such as an $N^+$ conductivity. For some embodiments, semiconductor 700 may be formed over an underlying active area or wiring, such as a complimentary metal-oxide semiconductor (CMOS). Dielectric 702 may generally be formed of one or more dielectric materials, such as an oxide, e.g., silicon oxide, an oxynitride, e.g., silicon oxynitride, etc.

Subsequently, a conductor 704 may be formed over dielectric 702, and a dielectric 706 may be formed over conductor 704. Conductor 704 may generally be formed of one or more conductive materials, such as polysilicon. Dielectric 706 may generally be formed of one or more dielectric materials, such as an oxide, e.g., silicon oxide, an oxynitride, e.g., silicon oxynitride, etc.

Dielectric 706 may then be patterned to form openings 710 through dielectric 706, conductor 704, and dielectric 702, stopping on or in semiconductor 700. For example, a mask (not shown), e.g., imaging resist, such as photo-resist, may be formed over dielectric 706 and patterned to expose regions of dielectric 706, conductor 704, and dielectric 702. The exposed regions of dielectric 706, conductor 704, and dielectric 702 may be subsequently removed, e.g., by etching, to form openings 710 that terminate at or within semiconductor 700.

Figure 7A:
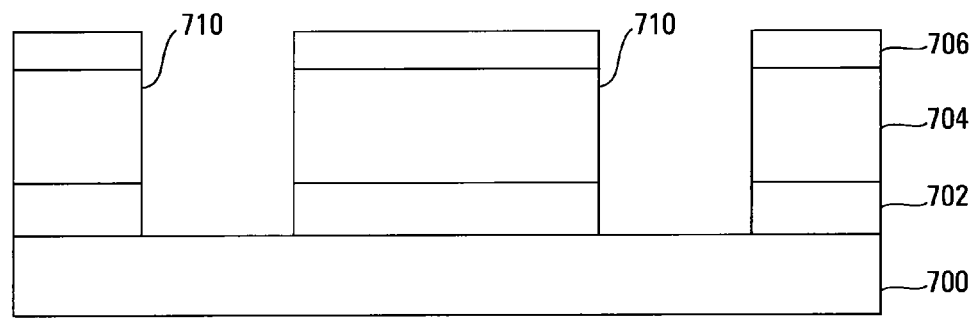
FIGS. 7A-7F are cross-sectional views of a portion of a memory array during various stages of fabrication, according to another embodiment.
Figure 7B:
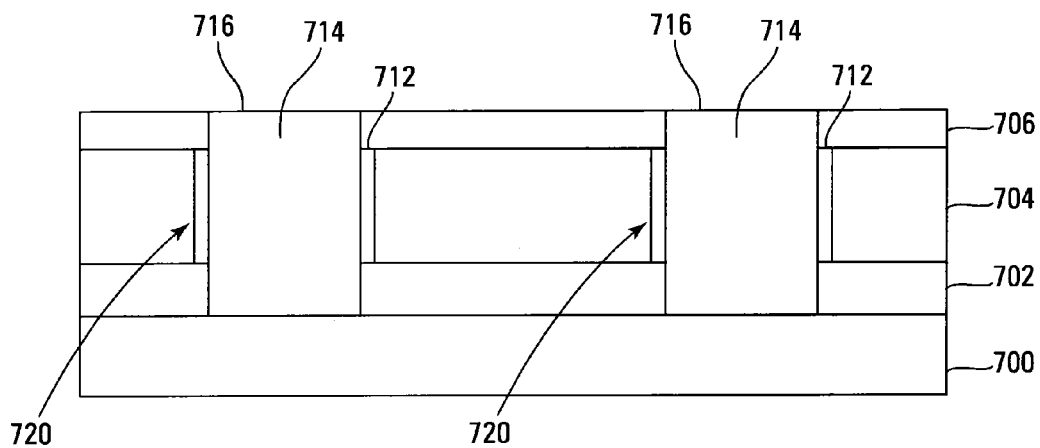

A dielectric 712 may then be formed in openings 710, such as on exposed edges of conductor 704 (e.g., that form a portion of the sidewalls of openings 710), as shown in FIG. 7B. For example, dielectric 712 may be an oxide and may be formed by oxidizing conductor 704.

Each of openings 710 may then be filled with a conductor 714 to form a pillar (e.g., a plug) 716 in each of openings 710, as shown in FIG. 7B. Conductor 714 may generally be formed of one or more conductive materials, such as polysilicon, e.g., that may be conductively doped (e.g., to a P-type conductivity).

For example, conductor 714 may overfill openings 710 and may extend over the upper surface of dielectric 706, e.g., adjacent to openings 710. Conductor 714 may then be removed from the upper surface of dielectric 706, e.g., by chemical mechanical planarization (CMP) so the upper surfaces of pillars 716 are substantially flush with (e.g., are flush with) the upper surface of dielectric 706. A dielectric 712 and conductor 704 may form a select gate 720 (e.g., a source select gate) adjacent to (in contact with) each of pillars 716.

Figure 7C:
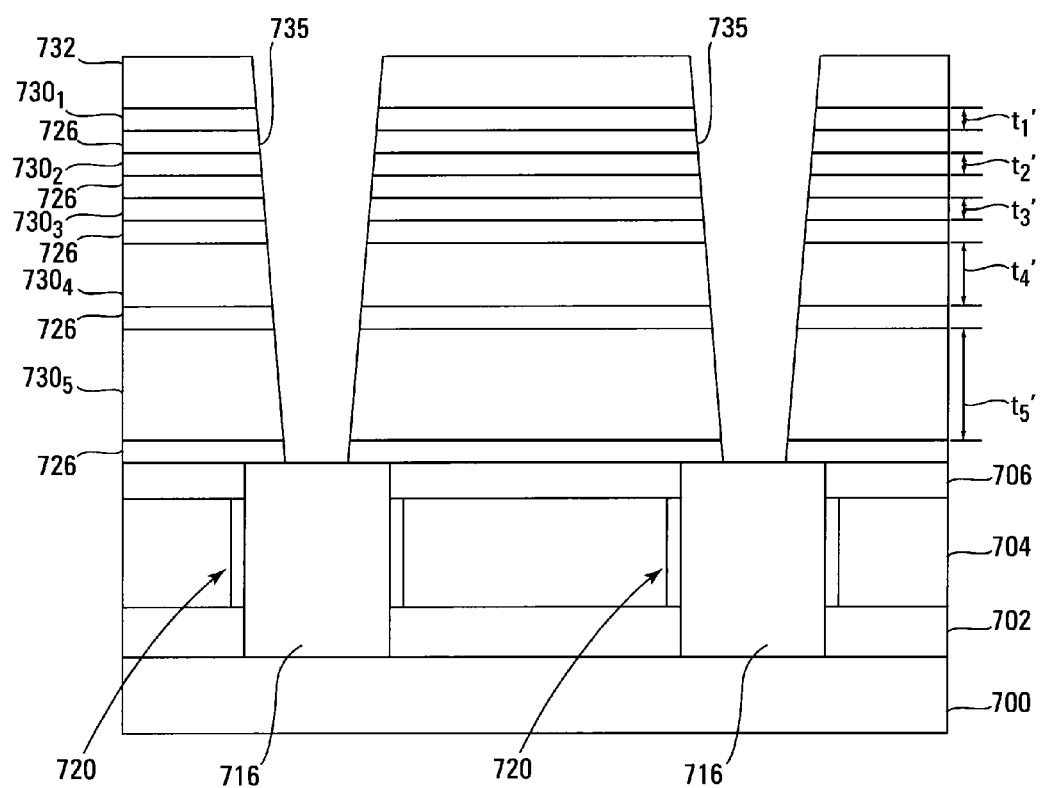

Alternating dielectrics 726 and conductors 730 are then formed over dielectric 706, as shown in FIG. 7C. Dielectrics 726 may generally be formed of one or more dielectric materials, such as an oxide, e.g., silicon oxide, an oxynitride, e.g., silicon oxynitride, etc. Conductors 730 may generally be formed of one or more conductive materials, such as polysilicon. A dielectric 732 may then be formed over the uppermost conductor 730, e.g., conductor $730_1$. Dielectric 732 may generally be formed of one or more dielectric materials, such as an oxide, e.g., silicon oxide, an oxynitride, e.g., silicon oxynitride, etc.

Dielectric 732 may then be patterned to form openings 735, such as substantially vertical (e.g., vertical), openings, through conductors $730_1$-$730_5$ and dielectrics 726, stopping at or within pillars 716, as shown in FIG. 7C. For example, a mask (not shown), e.g., of photoresist, may be formed over dielectric 732 and patterned for exposing portions conductors $730_1$-$730_5$ and dielectrics 726. The exposed portions of conductors $730_1$-$730_5$ and dielectrics 726 are then removed, such as by etching, thereby forming openings 735 that leave edges of conductors $730_1$-$730_5$ and dielectrics 726 exposed.

The process (e.g., the etching process) that forms openings 735 can cause openings to be tapered in a direction from top to bottom so that the size of, such as the cross-sectional area and/or the perimeter of, each opening 735 is smaller near its bottom than near its top. For example, the size of, such as the cross-sectional area and/or the perimeter of, each opening 735 may decrease with increasing distance from the top of each opening 735.

Conductors 730 may be formed so that their thicknesses (e.g., in the vertical direction) increase as the size of an adjacent opening 735 decreases. For some embodiments, the thicknesses of the conductors 730 near the top of an adjacent opening 735 remain substantially the same, and the thicknesses of the conductors 730 do not start to increase as the size of an adjacent opening 735 decreases until a certain distance from the top of the adjacent opening 735, e.g., until a certain conductor 730, such as conductor $730_4$.

For example, the thicknesses $t_1'$ to $t_3'$ respectively of conductors $730_1$ to $730_3$ may be substantially equal to (e.g., equal to) each other, whereas thickness $t_4'$ of conductor $730_4$ may be greater than thickness $t_3'$ of conductor $730_3$ and thickness $t_5'$ of conductor $730_5$ may be greater than thickness $t_4'$ of conductor $730_4$, as shown in FIG. 7C. For other embodiments, thickness $t_2'$ of conductor $730_2$ may be greater than thickness $t_1'$ of conductor $730_1$; thickness $t_3'$ of conductor $730_3$ may be greater than thickness $t_2'$ of conductor $730_2$; thickness $t_4'$ of conductor $730_4$ may be greater than thickness $t_3'$ of conductor $730_3$; and thickness $t_5'$ of conductor $730_5$ may be greater than thickness $t_4'$ of conductor $730_4$.

Figure 7D:
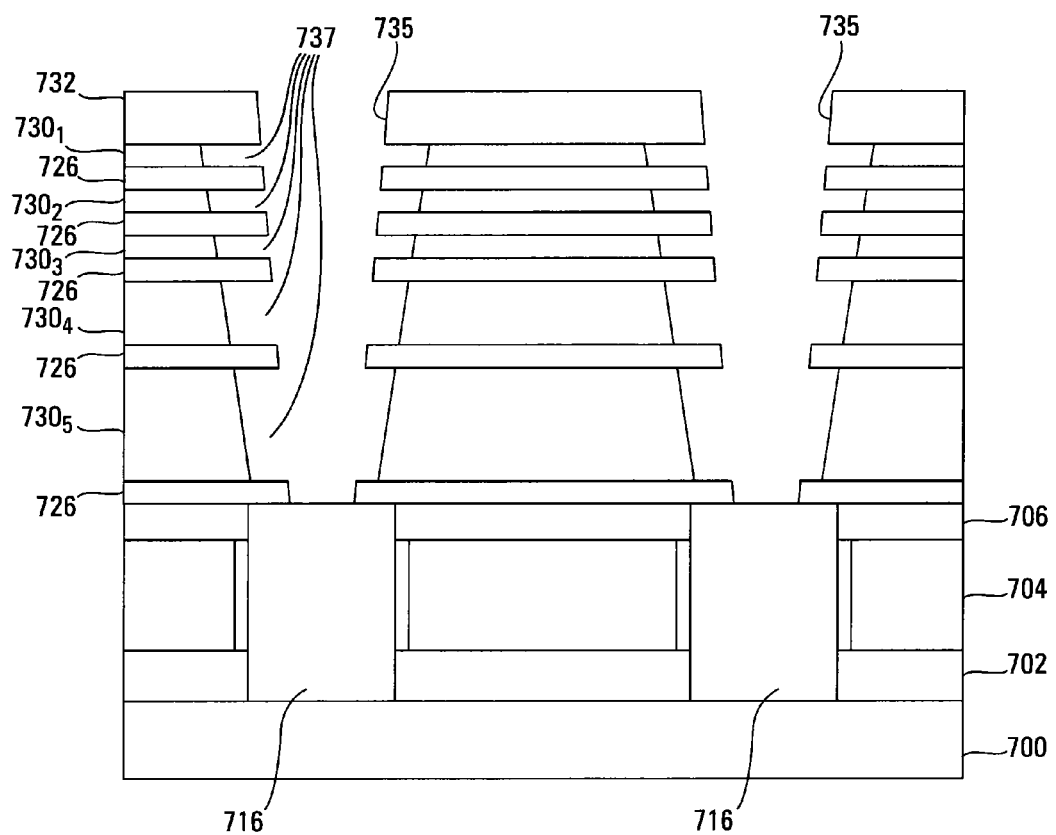

In FIG. 7D portions of conductors 730 may be removed (e.g., etched back) so that their edges are indented (e.g., recessed) relative to the edges of dielectrics 726 and dielectric 732, and thus the sidewalls of openings 735, to form indentations (e.g., recesses) 737 between adjacent ones of dielectrics 726 and between the uppermost dielectric 726 and dielectric 732, and thus in the sidewalls of openings 735.

Subsequently, in FIG. 7E, dielectrics 740, 742, and 746 and a conductor 744 may be formed in each indentation 737 that was formed in FIG. 7D. For example, dielectric 740 may be formed in each indentation 737 adjacent to (e.g., in contact with) a corresponding conductor 730; a dielectric 742 may be formed in each indentation 737 adjacent to (e.g., in contact with) a corresponding dielectric 740; a conductor 744 may be formed in each indentation 737 adjacent to (e.g., in contact with) a corresponding dielectric 742; and a dielectric 746 may be formed in each indentation 737 adjacent to (e.g., in contact with) a corresponding conductor 744. Dielectrics 740, 742, and 746 may generally be formed of one or more dielectric materials, such as an oxide, e.g., silicon oxide, an oxynitride, e.g., silicon oxynitride, etc. For some embodiments, dielectric 742 may include oxide and nitride.

The edges of dielectrics 746 may form portions of the sidewalls of openings 735. For example, the edge of each uppermost dielectric 746 may be substantially flush with the edge of dielectric 732 on one side thereof and the dielectric 726 on the other side thereof, and the edges of the remaining dielectrics 746 may be substantially flush with the edges of the dielectrics 726 on either side a respective dielectric 746.

Figure 7E:
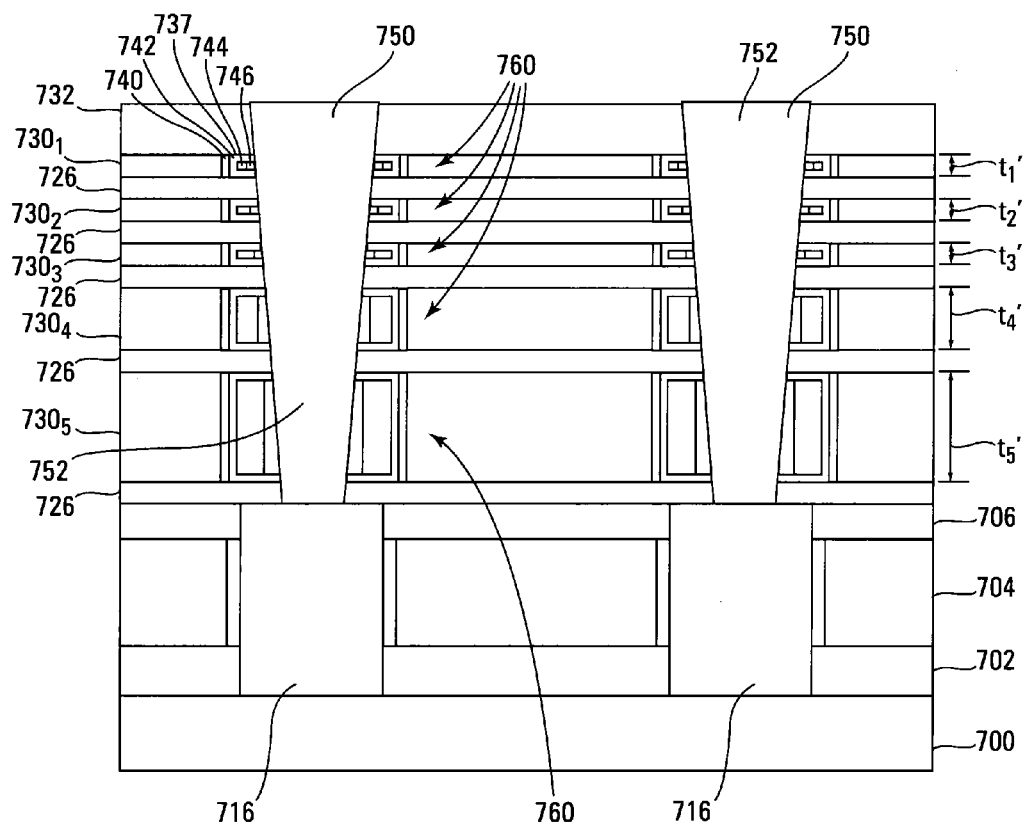

For some embodiments, portions (e.g., prongs) of a dielectric 742 may be formed over portions of the dielectrics 726 on either side of a respective indentation 737 or over a dielectric 726 on one side of the uppermost indentation 737 and the dielectric 732 on the other side of the uppermost indentation 737 and may extend toward a respective opening 735, as shown in FIG. 7E. For these embodiments, a conductor 744 and a dielectric 746 may be between the prongs of a respective a dielectric 742, as shown in FIG. 7E.

Each of openings 735 may then be filled with a semiconductor 750 to form a substantially vertical (e.g., a vertical) pillar (e.g., a plug) 752 in each of openings 735, as shown in FIG. 7E. For some embodiments, each pillar 752 may be directly vertically above and in substantial vertical alignment with (e.g., in vertical alignment with) a corresponding pillar 716. For example, each pillar 752 may be physically coupled to (e.g., may be in direct physical contact with) a corresponding pillar 716. Semiconductor 750 may generally be formed of polysilicon, e.g., that may be conductively doped (e.g., to a P-type conductivity). For some embodiments, conductor 750 may be planarized (e.g., using CMP) so that the upper surfaces of pillars 752 are substantially flush with (e.g., flush with) the upper surface of dielectric 732.

Note that pillars 752 may be tapered in a direction from top to bottom so that the size of, such as the cross-sectional area and/or the perimeter of, each pillar 752 is smaller near its bottom than near its top. For example, the size of each pillar 752 may decrease with increasing distance from the top of the respective pillar 752. This is because pillars 752 may take on substantially the shape of tapered openings 735 in which they are formed.

Note that the thicknesses (e.g., in the vertical direction) of conductors 730 increase as the size of an adjacent pillar 752 decreases. For example, the thicknesses of conductors 730 may increase with increasing distance from the top of an adjacent pillar 752. For some embodiments, the thicknesses of the conductors 730 near the top of an adjacent pillar may remain substantially the same, and, the thicknesses of the conductors 730 might not start to increase as the size of an adjacent pillar 752 decreases until a certain distance from the top of the adjacent pillar 752, e.g., until a certain conductor 730, such as conductor $730_4$.

For some embodiments, dielectrics 726 and 746 may be adjacent to (e.g., in contact with) an adjacent one of pillars 752. For example, a dielectric 746 may form a tunnel dielectric of a memory cell 760 adjacent to a corresponding pillar, as shown in FIG. 7E. A conductor 744 adjacent to a tunnel dielectric of a memory cell 760 might form a charge-storage structure, such as a floating gate, of the memory cell 760; dielectrics 740 and 742 might form an interlayer dielectric (e.g., a blocking dielectric) of the memory cell 760; and a conductor 730 might form a control gate of the memory cell 760 (e.g., that may form a portion of or might be coupled to an access line, such as a word line).

Figure 7F:
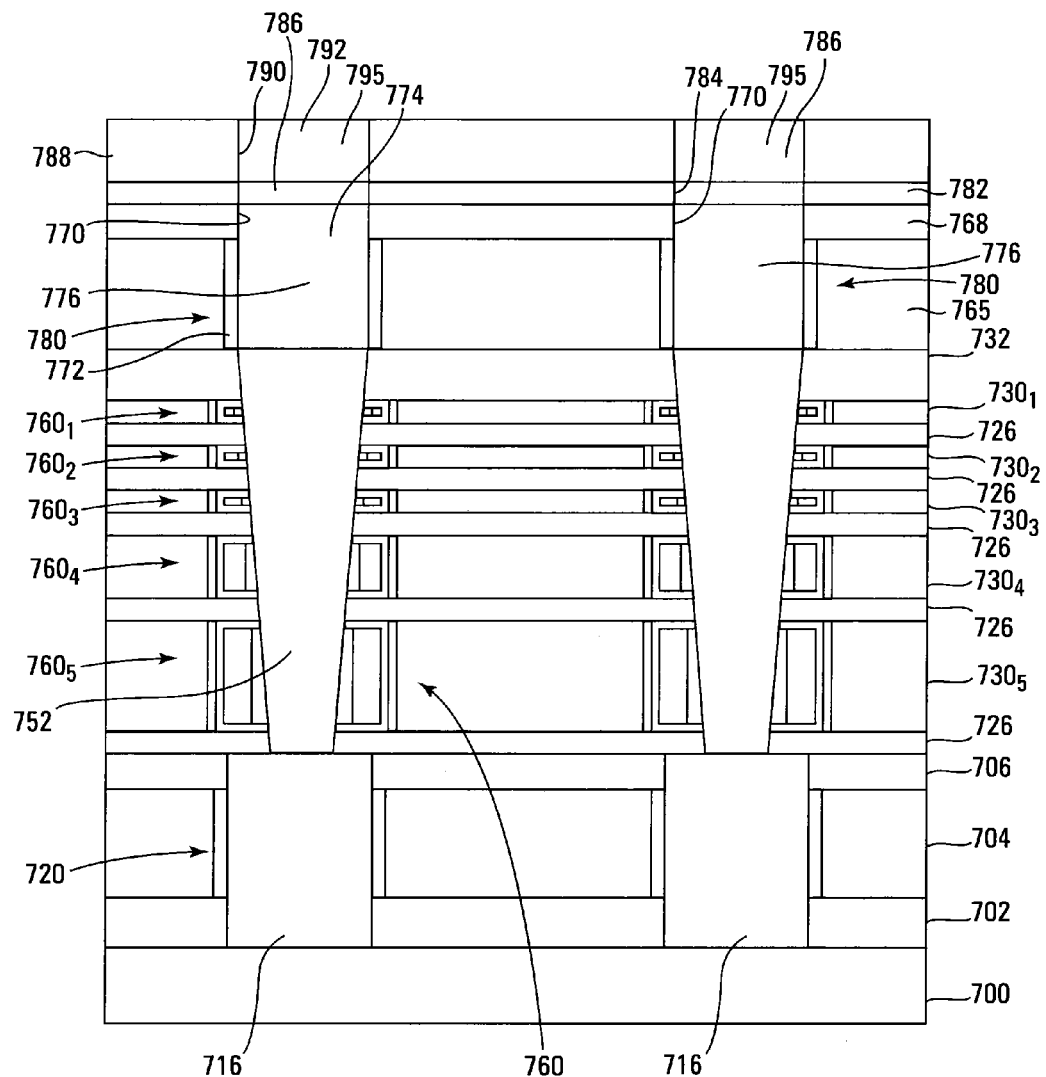

There might be a plurality of memory cells 760, such as memory cells $760_1$ to $760_5$, e.g., coupled in series to form a string of memory cells 760, adjacent to (e.g., in contact with) each of pillars 752, as shown in FIG. 7F. For some embodiments, the conductor 744 that forms the charge-storage structure of a memory cell 760 might be replaced with a dielectric charge trap, e.g., of nitride, a high-dielectric constant (high-K) dielectric, etc.

Note that the thicknesses (e.g., in the vertical direction), e.g., the channel lengths, of memory cells 760 increase as the size of an adjacent pillar 752 decreases, as shown in FIGS. 7E and 7F. For example, the channel lengths of memory cells 760 may increase with increasing distance from the top of an adjacent pillar 752. For some embodiments, the channel lengths of the memory cells 760, such as memory cells $760_1$ to $760_3$ in FIG. 7F, near the top of an adjacent pillar 752 may remain substantially the same, and the channel lengths of the memory cells 760 might not start to increase as the size of an adjacent pillar 752 decreases until a certain distance from the top of the adjacent pillar 752, e.g., until a certain memory cell 760, such as memory cell $760_4$.

In FIG. 7F a conductor 765 may be then formed over dielectric 732 and upper surfaces of pillars 752, and a dielectric 768 may be formed over conductor 765. Conductor 765 may generally be formed of one or more conductive materials, such as polysilicon. Dielectric 768 may generally be formed of one or more dielectric materials, such as an oxide, e.g., silicon oxide, an oxynitride, e.g., silicon oxynitride, etc.

Dielectric 768 may then be patterned to form openings 770 through dielectric 768 and conductor 765, stopping at or in pillars 752. For example, a mask (not shown), e.g., imaging resist, such as photo-resist, may be formed over dielectric 768 and patterned to expose regions of dielectric 768 and conductor 765. The exposed regions of dielectric 768 and conductor 765 may be subsequently removed, e.g., by etching, to form openings 770 that terminate at or within pillars 752.

A dielectric 772 may then be formed in openings 770, such as on exposed edges of conductor 765 (e.g., that form a portion of the sidewalls of openings 770), as shown in FIG. 7F. For example, dielectric 772 may be an oxide and may be formed by oxidizing conductor 765.

Each of openings 770 may then be filled with a conductor 774 to form a pillar (e.g., a plug) 776 in each of openings 770, as shown in FIG. 7F. Conductor 774 may generally be formed of one or more conductive materials, such as polysilicon, e.g., that may be conductively doped (e.g., to a P-type conductivity).

For example, conductor 774 may overfill openings 770 and may extend over the upper surface of dielectric 768, e.g., adjacent to openings 770. Conductor 774 may then be removed from the upper surface of dielectric 768, e.g., by chemical mechanical planarization (CMP) so the upper surfaces of pillars 776 are substantially flush with (e.g., flush with) the upper surface of dielectric 768. A dielectric 772 and conductor 774 may form a select gate 780 (e.g., a drain select gate) adjacent to (in contact with) each of pillars 776.

For some embodiments, each pillar 776 may be directly vertically above and in substantial vertical alignment with (e.g., in vertical alignment with) a corresponding pillar 752. For example, each pillar 776 may be physically coupled to (e.g., may be in direct physical contact with) a corresponding pillar 752.

A dielectric 782 may then be formed over dielectric 768 and the upper surfaces of pillars 776. Dielectric 782 may generally be formed of one or more dielectric materials, such as an oxide, e.g., silicon oxide, an oxynitride, e.g., silicon oxynitride, etc.

Dielectric 782 may then be patterned to form openings 784 through dielectric 782, stopping at or in pillars 776. For example, a mask (not shown), e.g., imaging resist, such as photo-resist, may be formed over dielectric 782 and patterned to expose regions of dielectric 782. The exposed regions of dielectric 782 may be subsequently removed, e.g., by etching, to form the openings 784 that terminate at or within pillars 776.

A conductor 786 may then be formed in each of openings 784. The conductors 786 in each of openings may be planarized so that the upper surface of each conductor 774 is substantially flush with (e.g., is flush with) the upper surface of dielectric 782. Conductors 786 may generally be formed of one or more conductive materials, such as polysilicon, e.g., that may be conductively doped (e.g., to an N$^+$-type conductivity).

A dielectric 788 may then be formed over dielectric 782 and the upper surfaces of conductors 786. Dielectric 788 may generally be formed of one or more dielectric materials, such as an oxide, e.g., silicon oxide, an oxynitride, e.g., silicon oxynitride, etc.

Dielectric 788 may then be patterned to form openings 790 through dielectric 788, stopping at or in conductors 786. For example, a mask (not shown), e.g., imaging resist, such as photo-resist, may be formed over dielectric 788 and patterned to expose regions of dielectric 788. The exposed regions of dielectric 788 may be subsequently removed, e.g., by etching, to form the openings 790 that terminate at or within conductors 786.

A conductor 792 may then be formed in each of openings 790, where each conductor may form a data line, such as a bit line 795. Conductors 792 may be formed of one or more conductive materials and may comprise, consist of, or consist essentially of conductively doped polysilicon and/or may comprise, consist of, or consist essentially of metal, such as a refractory metal, aluminum, copper, etc., or a metal-containing material, such as a refractory metal silicide layer, as well as other conductive materials. The metals of chromium (Cr), cobalt (Co), hafnium (Hf), molybdenum (Mo), niobium (Nb), tantalum (Ta), titanium (Ti), tungsten (W), vanadium(V) and zirconium (Zr) are generally recognized as refractory metals.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory array, comprising:
   a substantially vertical pillar; and
   memory cells adjacent to the pillar;
   wherein a memory cell adjacent to the pillar where the pillar has a first size has a greater channel length than a memory cell adjacent to the pillar where the pillar has a second size larger than the first size.

2. The memory array of claim 1, wherein the first and the second sizes respectively comprise first and second perimeters and/or first and second cross-sectional areas.

3. The memory array of claim 1, wherein the memory cell adjacent to the pillar where the pillar has the second size is at a vertical level within the memory array that is above a vertical level of the memory cell adjacent to the pillar where the pillar has the first size.

4. The memory array of claim 1, wherein the memory cell adjacent to the pillar where the pillar has the first size shares a common charge-storage structure with the memory cell adjacent to the pillar where the pillar has the second size.

5. The memory array of claim 1, wherein the memory cell adjacent to the pillar where the pillar has the first size and the memory cell adjacent to the pillar where the pillar has the second size are in contact with surface areas of the pillar that are substantially the same.

6. The memory array of claim 1, wherein the memory cell adjacent to the pillar where the pillar has the first size and the memory cell adjacent to the pillar where the pillar has the second size respectively comprise charge-storage structures that have substantially equal volumes.

7. The memory array of claim 1, wherein the memory cell adjacent to the pillar where the pillar has the first size and the memory cell adjacent to the pillar where the pillar has the second size have substantially the same channel capacitance.

8. The memory array of claim 1, wherein the memory cell adjacent to the pillar where the pillar has the first size and the memory cell adjacent to the pillar where the pillar has the second size are part of a series-coupled string of memory cells adjacent to the pillar.

9. The memory array of claim 8, wherein the series-coupled string of memory cells comprises a plurality of memory cells other than the memory cell adjacent to the pillar where the pillar has the first size and the memory cell adjacent to the pillar where the pillar has the second size that have substantially the same channel lengths.

10. The memory array of claim 9, wherein the memory cells that have substantially the same channel lengths are respectively adjacent to portions of the pillar that have different sizes.

11. The memory array of claim 10, wherein the different sizes of the portions of the pillar adjacent to the memory cells that have substantially the same channel lengths are each larger than the first and second sizes of the pillar.

12. The memory array of claim 1, wherein the memory cell adjacent to the pillar where the pillar has the first size and the memory cell adjacent to the pillar where the pillar has the second size are between and coupled in series with first and second "dummy" memory cells.

13. The memory array of claim 12, wherein the first and second "dummy" memory cells have substantially the same channel lengths.

14. The memory array of claim 12, wherein the first "dummy" memory cell is adjacent to the pillar where the pillar has a size larger than the second size and the second "dummy" memory cell is adjacent to the pillar where the pillar has a size that is smaller than the first size.

15. The memory array of claim 1, wherein the pillar comprises a first pillar, the memory cell adjacent to the pillar where the pillar has the first size comprises a first memory cell, and the memory cell adjacent to the pillar where the pillar has the second size comprises a second memory cell, and further comprising:
a substantially vertical second pillar physically coupled to the first pillar;
wherein a third memory cell adjacent to the second pillar where the second pillar has a third size has a greater channel length than a fourth memory cell adjacent to the second pillar where the second pillar has a fourth size larger than the third size.

16. The memory array of claim 15, wherein the first and second memory cells are coupled in series with the third and fourth memory cells.

17. The memory array of claim 16, wherein each of the first, second, third, and fourth memory cells are between and coupled in series with first and second select gates.

18. The memory array of claim 15, wherein the first and second pillars are located side by side.

19. The memory array of claim 15, wherein the first and second pillars are stacked one above the other.

20. A memory array, comprising:
a substantially vertical pillar comprising a cross-sectional area that decreases with increasing distance from a top of the pillar;
a string of series-coupled memory cells adjacent to the pillar;
wherein at least a portion of the memory cells of the string have thicknesses that increase with increasing distance from the top of the pillar.

21. The memory array of claim 20, wherein another portion of the memory cells of the string that are above the at least the portion of the memory cells of the string that have thicknesses that increase with increasing distance from a top of the pillar have thicknesses that are substantially the same as each other.

22. The memory array of claim 20, wherein the at least the portion of the memory cells of the string that have thicknesses that increase with increasing distance from the top of the pillar are between and coupled in series with first and second "dummy" memory cells.

23. The memory array of claim 22, wherein the first and second "dummy" memory cells have substantially the same thickness as each other.

24. The memory array of claim 20, wherein the pillar comprises a first pillar and the string of series-coupled memory cells adjacent to the first pillar comprises a first string of series-coupled memory cells adjacent to the first pillar, and further comprising:
a second pillar coupled to the first pillar, the second pillar comprising a cross-sectional area that decreases with increasing distance from a top of the second pillar;
a second string of series-coupled memory cells adjacent to the second pillar; and
wherein at least a portion of the memory cells of the second string have thicknesses that increase with increasing distance from the top of the second pillar.

25. The memory array of claim 24, wherein the second pillar is located laterally of the first pillar and the first and second strings are selectively coupled in series.

26. The memory array of claim 24, wherein the second pillar is located vertically above the first pillar and the first and second strings are coupled in series.

27. A memory array, comprising:
a substantially vertical semiconductor;
a charge storage structure adjacent to the substantially vertical semiconductor; and
a plurality of control gates adjacent to the charge storage structure;
wherein each memory cell of a portion of a series-coupled string of memory cells comprises a respective one of the control gates and a portion of the charge storage structure; and
wherein a control gate of a memory cell of the series-coupled string where the substantially vertical semiconductor has a first size has a greater thickness than a control gate of a memory cell of the series-coupled string where the substantially vertical semiconductor has a second size larger than the first size.

28. A memory array, comprising:
a substantially vertical semiconductor;
a series-coupled string of memory cells;
wherein each memory cell of the series-coupled string comprises:
a tunnel dielectric adjacent to the substantially vertical semiconductor;
a charge-storage structure adjacent to the tunnel dielectric;
a blocking dielectric adjacent to the charge-storage structure; and
a control gate adjacent to the blocking dielectric;
wherein a control gate of a memory cell of the series-coupled string where the substantially vertical semiconductor has a first size has a greater thickness than a control gate of a memory cell of the series-coupled string where the substantially vertical semiconductor has a second size larger than the first size.

29. The memory array of claim 28, further comprising a dielectric between at least the floating gates, blocking dielectrics, and control gates of successively adjacent memory cells of the series-coupled string.

30. The memory array of claim 28, wherein charge-storage structure is a floating gate.

31. The memory array of claim 28, wherein charge-storage structure is a charge trap.

* * * * *